US012813048B2

(12) United States Patent
Jang et al.

(10) Patent No.: US 12,813,048 B2
(45) Date of Patent: Nov. 24, 2026

(54) DISPLAY APPARATUS

(71) Applicant: LG Display Co., Ltd., Seoul (KR)

(72) Inventors: Youngin Jang, Seoul (KR); Yongmin Ha, Seoul (KR); Kwangsu Lim, Seoul (KR); Soyoung Lee, Seoul (KR); Hyungon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 356 days.

(21) Appl. No.: 18/422,944

(22) Filed: Jan. 25, 2024

(65) Prior Publication Data

US 2024/0258485 A1 Aug. 1, 2024

(30) Foreign Application Priority Data

Jan. 31, 2023 (KR) ........................ 10-2023-0013296

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC .. H10H 20/857; H10H 29/142; H10H 20/853; H10W 90/00
See application file for complete search history.

(56) References Cited

U.S. PATENT DOCUMENTS 11,637,169 B2 * 4/2023 Jang ...................... H10W 90/00 257/88
11,776,485 B2 * 10/2023 Park ..................... G09G 3/3233 345/55
12,284,864 B2 * 4/2025 Jang ...................... H10K 59/131
12,289,973 B2 * 4/2025 Kim ..................... G09G 3/2096
12,543,375 B2 * 2/2026 Shin ..................... H10D 86/441
12,550,789 B2 * 2/2026 Jang ...................... H10W 90/00
2020/0135764 A1 4/2020 Ha et al.
2021/0202675 A1 * 7/2021 Jang ...................... H10W 90/00
2022/0077272 A1 3/2022 Jeong et al.
2022/0199952 A1 * 6/2022 Jang ..................... H10K 59/131
2022/0208130 A1 * 6/2022 Park ..................... G09G 3/3233
2022/0208946 A1 * 6/2022 Kim ..................... H10K 59/131
2023/0205362 A1 * 6/2023 Lee ....................... G06F 3/0418 345/174
2023/0215878 A1 * 7/2023 Shin ..................... H10D 86/441 257/91

(Continued)

FOREIGN PATENT DOCUMENTS

CN 114764996 A * 7/2022 ............... G09G 3/32
CN 116339533 A * 6/2023 ......... G06F 3/04164

(Continued)

*Primary Examiner* — Laura M Menz
(74) *Attorney, Agent, or Firm* — Birch, Stewart, Kolasch & Birch, LLP

(57) ABSTRACT

A display apparatus in one example includes a wiring substrate having a plurality of link lines, a display part disposed on the wiring substrate, the display part including a plurality of light-emitting elements and a plurality of signal lines, a first pad electrode overlapping an end of the plurality of link lines, a second pad electrode overlapping an end of the plurality of signal lines, and a conductive pattern electrically connected to the first pad electrode and the second pad electrode.

14 Claims, 8 Drawing Sheets

(56) References Cited

U.S. PATENT DOCUMENTS

| | | | | |
|---|---|---|---|---|
| 2023/0232682 | A1* | 7/2023 | Jang | H10W 90/00 257/88 |
| 2024/0258485 | A1* | 8/2024 | Jang | H10H 20/857 |
| 2024/0260385 | A1* | 8/2024 | Jang | H10K 59/131 |

FOREIGN PATENT DOCUMENTS

| | | | | | |
|---|---|---|---|---|---|
| CN | 116347943 | A | * | 6/2023 | H10K 59/124 |
| CN | 121368250 | A | * | 1/2026 | H10H 29/37 |
| EP | 4016635 | A1 | * | 6/2022 | H10K 59/18 |
| GB | 2594549 | A | * | 11/2021 | H10W 90/00 |
| GB | 2609142 | A | * | 1/2023 | G09F 9/302 |
| JP | 2023094548 | A | * | 7/2023 | H10D 86/60 |
| KR | 10-2020-0046913 | A | | 5/2020 | |
| KR | 10-2020-0061743 | A | | 6/2020 | |
| KR | 10-2022-0032866 | A | | 3/2022 | |
| KR | 10-2022-0135066 | A | | 10/2022 | |
| KR | 20230096541 | A | * | 6/2023 | H10D 86/60 |

* cited by examiner

DISPLAY APPARATUS

CROSS-REFERENCE TO RELATED APPLICATION

This application claims priority, under 35 U.S.C. 119, to Korean Patent Application No. 10-2023-0013296 filed on Jan. 31, 2023, in the Korean Intellectual Property Office, the entire contents of which is hereby expressly incorporated by reference into the present application.

BACKGROUND OF THE DISCLOSURE

Technical Field

The present disclosure relates to a display apparatus, and more specifically, to a display apparatus in which a wiring substrate and a display part can be electrically connected to each other.

Discussion of the Related Art

A display apparatus is applied to various electronic devices such as TVs, mobile phones, laptops, and tablets. Thus, research to develop the thinning, low weight, and low power consumption features of the display apparatus is continuing.

Among the display apparatuses, a light-emitting display apparatus has a light-emitting element or a light source built therein and displays information using light generated from the built-in light-emitting element or light source. A display apparatus including a self-light-emitting element can be implemented to be thinner than a display apparatus with the built-in light source, and can be implemented as a flexible display apparatus that can be folded, bent, or rolled.

SUMMARY OF THE DISCLOSURE

The display apparatus having the self-light-emitting element can include, for example, an organic light-emitting display apparatus (OLED) including a light-emitting layer formed of an organic material, or a micro-LED (micro-light emitting diode) display apparatus including a light-emitting layer formed of an inorganic material. In this regard, the organic light-emitting display apparatus does not require a separate light source.

However, due to the material characteristics of the organic material that is vulnerable to moisture and oxygen, a defective pixel can occur in the organic light-emitting display apparatus due to an external environment. On the contrary, the micro-LED display apparatus includes the light-emitting layer formed of the inorganic material that is resistant to moisture and oxygen and thus is not affected by the external environment. As such, the micro-LED display apparatus can have high reliability and a long lifespan compared to the organic light-emitting display apparatus.

An aspect of the present disclosure is to provide a transparent display apparatus having a large area.

Another aspect of the present disclosure is to provide a display apparatus having process optimization.

Another aspect of the present disclosure is to provide a display apparatus having a repair process.

Another aspect of the present disclosure is to provide a display apparatus which addresses the limitations associated with the related art.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

To achieve these and other advantages and aspects of the present disclosure, as embodied and broadly described herein, a display apparatus comprises a wiring substrate including a plurality of link lines, a display part disposed on the wiring substrate, the display part including a plurality of light-emitting elements and a plurality of signal lines, a first pad electrode overlapping an end of the plurality of link lines. a second pad electrode overlapping an end of the plurality of signal lines; and a conductive pattern electrically connected to the first pad electrode and the second pad electrode.

According to an aspect of the present disclosure, a transparent display apparatus of a large area can be realized by overlapping the display part with the upper surface of the wiring substrate.

Furthermore, the display part can be bonded (or attached) onto a wiring substrate and can be electrically connected thereto by a conductive pattern by an inkjet or printing method. Thus, a plurality of processes such as forming a through-electrode or forming a conductive contact member can be omitted, thereby implementing process optimization and thus reducing production energy.

Furthermore, the wiring substrate and the display part can be electrically connected to each other by a conductive pattern formed between the plurality of pad electrodes respectively disposed on the wiring substrate and the display part. Thus, when a signal communication failure occurs, it is easy to repair the defective conductive pattern, thereby implementing process optimization and thus reducing production energy.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory and are intended to provide further explanation of the disclosure inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain principles of the disclosure.

Figure 1:
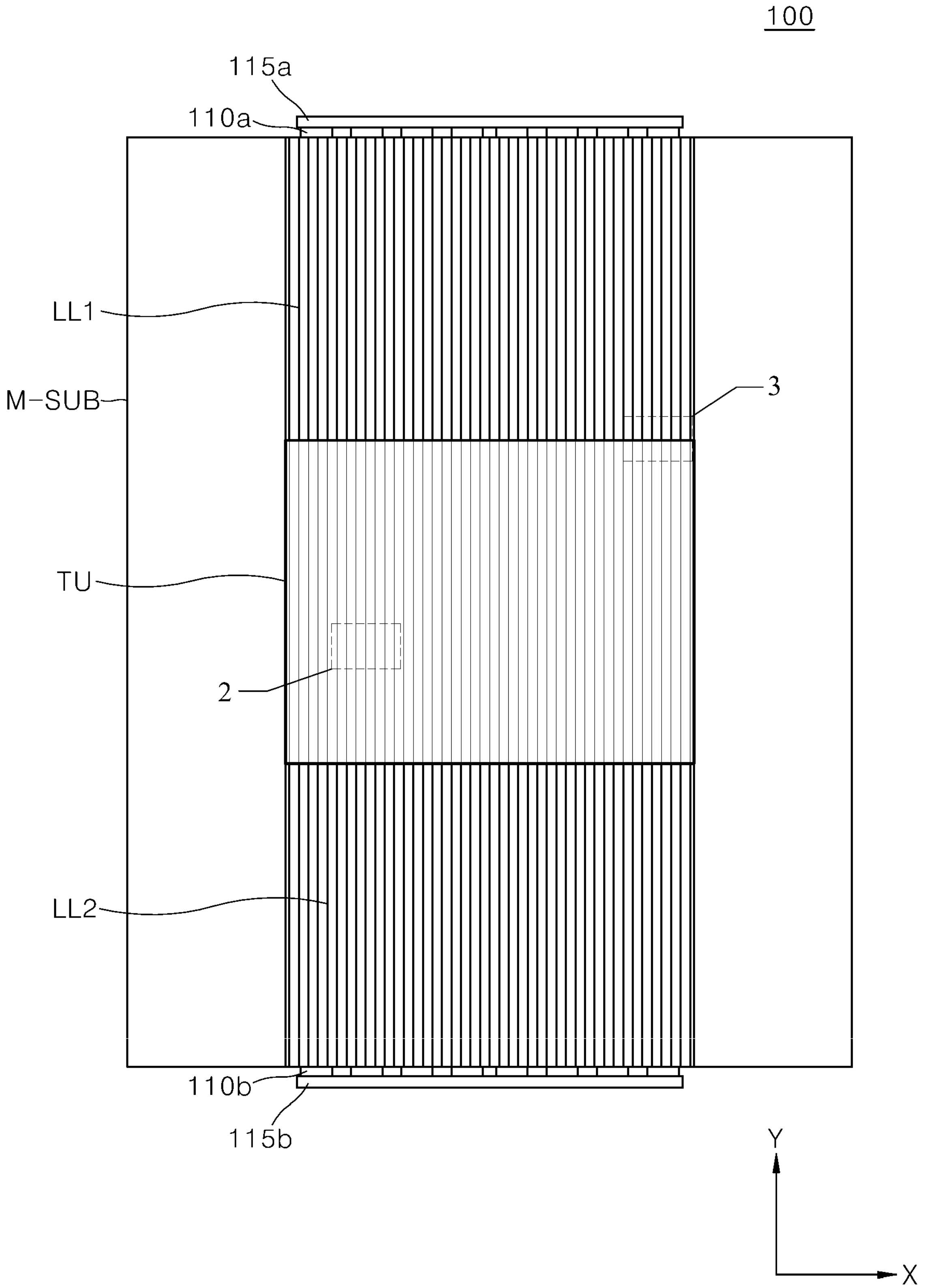
FIG. 1 illustrates a plan view of a display apparatus according to an aspect of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction of thereof can be exaggerated for clarity, illustration, and/or convenience.

DETAILED DESCRIPTION OF THE EMBODIMENTS

Reference is now made in detail to aspects of the present disclosure, examples of which can be illustrated in the accompanying drawings. In the following description, when a detailed description of well-known functions, structures or configurations can unnecessarily obscure aspects of the present disclosure, the detailed description thereof can have been omitted for brevity. Further, repetitive descriptions can be omitted for brevity. The progression of processing steps and/or operations described is a non-limiting example.

The sequence of steps and/or operations is not limited to that set forth herein and can be changed to occur in an order that is different from an order described herein, with the exception of steps and/or operations necessarily occurring in a particular order. In one or more examples, two operations in succession can be performed substantially concurrently, or the two operations can be performed in a reverse order or in a different order depending on a function or operation involved.

Unless stated otherwise, like reference numerals can refer to like elements throughout even when they are shown in different drawings. In one or more aspects, identical elements (or elements with identical names) in different drawings can have the same or substantially the same functions and properties unless stated otherwise. Names of the respective elements used in the following explanations are selected only for convenience and can be thus different from those used in actual products.

Advantages and features of the present disclosure, and implementation methods thereof, are clarified through the aspects described with reference to the accompanying drawings. The present disclosure may however, be embodied in different forms and should not be construed as limited to the aspects set forth herein. Rather, these aspects examples and are provided so that this disclosure can be thorough and complete, and to assist to those of skill in the art to understand the inventive concepts without limiting the protected scope of the present disclosure.

Shapes (e.g., sizes, lengths, widths, heights, thicknesses, locations, radii, diameters, and areas), angles, numbers, and the like disclosed herein, including those illustrated in the drawings are merely examples, and thus, the present disclosure is not limited to the illustrated details. Any implementation described herein as an "example" is not necessarily to be construed as preferred or advantageous over other implementations. It is, however, noted that the relative dimensions of the components illustrated in the drawings are part of the present disclosure.

When the term "comprise," "have," "include," "contain," "constitute," "made up of," "formed of," or the like is used with respect to one or more elements, one or more other elements can be added unless a term such as "only" or the like is used. The terms used in the present disclosure are merely used in order to describe example aspects, and are not intended to limit the scope of the present disclosure. The terms of a singular form can include plural forms unless the context clearly indicates otherwise.

The word "exemplary" is used to mean serving as an example or illustration. Aspects are example aspects. Further, "examples," "aspects," and the like should not be construed as preferred or advantageous over other implementations. An aspect, an example, an example aspect, an aspect, or the like can refer to one or more aspects, one or more examples, one or more example aspects, one or more aspects, or the like, unless stated otherwise.

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range can be caused by various factors (e.g., process factors, internal or external impact, noise, or the like). In interpreting a numerical value, the value is interpreted as including an error range unless explicitly stated otherwise.

In describing a positional relationship, where the positional relationship between two parts (e.g., layers, films, regions, components, sections, or the like) is described, for example, using "on," "upon," "on top of," "over," "under," "above," "below," "beneath," "near," "close to," "adjacent to," "beside," "next to," "at or on a side of," or the like, one or more parts can be located between two other parts unless a more limiting term, such as "immediate(ly)," "direct(ly)," or "close(ly)," is used. For example, when a structure is described as being positioned "on," "on a top of," "upon," "on top of," "over," "under," "above," "below," "beneath," "near," "close to," "adjacent to," "beside," or "next to," "at or on a side of," or the like another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, can include all directions of "above" and "below." Likewise, an exemplary term "above" or "on" can include both directions of "above" and "below."

In describing a temporal relationship when the temporal order is described as "after," "subsequent," "next," "before,"

"preceding," "prior to," or the like a case which is not consecutive or not sequential can be included and thus one or more other events can occur therebetween, unless a more limiting term, such as "just," "immediate(ly)," or "direct(ly)" is used.

The terms, such as "below," "lower," "above," "upper" and the like, can be used herein to describe a relationship between element(s) as illustrated in the drawings. It will be understood that the terms are spatially relative and based on the orientation depicted in the drawings.

It is understood that, although the terms "first", "second," or the like can be used herein to describe various elements (e.g., layers, films, regions, components, sections, or the like), these elements should not be limited by these terms. These terms are used only to partition one element from another. For example, a first element could be a second element, and, similarly, a second element could be a first element, without departing from the scope of the present disclosure. Furthermore, the first element, the second element, and the like can be arbitrarily named according to the convenience of those skilled in the art without departing from the scope of the present disclosure. For clarity, the functions or structures of these elements (e.g., the first element, the second element and the like) are not limited by ordinal numbers or the names in front of the elements. Further, a first element can include one or more first elements. Similarly, a second element or the like can include one or more second elements or the like.

In describing elements of the present disclosure, the terms "first," "second," "A," "B," "(a)," "(b)," or the like can be used. These terms are intended to identify the corresponding element(s) from the other element(s), and these are not used to define the essence, basis, order, sequence, or number of the elements.

For the expression that an element (e.g., layer, film, region, component, section, or the like) is "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phase that an element (e.g., layer, film, region, component, section, or the like) is "provided in," "disposed in," or the like in another element can be understood as that at least a portion of the element is provided in, disposed in, or the like in another element, or that the entirety of the element is provided in, disposed in, or the like in another element. The phase that an element (e.g., layer, film, region, component, section, or the like) "contacts," "overlaps," or the like with another element can be understood as that at least a portion of the element contacts, overlaps, or the like with a least a portion of another element, that the entirety of the element contacts, overlaps, or the like with a least a portion of another element, or that at least a portion of the element contacts, overlaps, or the like with the entirety of another element.

The terms such as a "line" or "direction" should not be interpreted only based on a geometrical relationship in which the respective lines or directions are parallel or perpendicular to each other, and can be meant as lines or directions having wider directivities within the range within which the components of the present disclosure can operate functionally. For example, the terms "first direction," "second direction," and the like, such as a direction parallel or perpendicular to "x-axis," "y-axis," or "z-axis," should not be interpreted only based on a geometrical relationship in which the respective directions are parallel or perpendicular to each other, and can be meant as directions having wider directivities within the range within which the components of the present disclosure can operate functionally.

The term "at least one" should be understood as including any and all combinations of one or more of the associated listed items. For example, each of the phrases of "at least one of a first item, a second item, or a third item" and "at least one of a first item, a second item, and a third item" can represent (i) a combination of items provided by two or more of the first item, the second item, and the third item or (ii) only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any of A, B, and C (e.g., A, B, or C); or some combination of A, B, and C (e.g., A and B; A and C; or B and C); or all of A, B, and C. Furthermore, an expression "A/B" can be understood as A and/or B. For example, an expression "A/B" can refer to only A; only B; A or B; or A and B.

In one or more aspects, the terms "between" and "among" can be used interchangeably simply for convenience unless stated otherwise. For example, an expression "between a plurality of elements" can be understood as among a plurality of elements. In another example, an expression "among a plurality of elements" can be understood as between a plurality of elements. In one or more examples, the number of elements can be two. In one or more examples, the number of elements can be more than two. Furthermore, when an element (e.g., layer, film, region, component, sections, or the like) is referred to as being "between" at least two elements, the element can be the only element between the at least two elements, or one or more intervening elements can also be present.

In one or more aspects, the phrases "each other" and "one another" can be used interchangeably simply for convenience unless stated otherwise. For example, an expression "different from each other" can be understood as being different from one another. In another example, an expression "different from one another" can be understood as being different from each other. In one or more examples, the number of elements involved in the foregoing expression can be two. In one or more examples, the number of elements involved in the foregoing expression can be more than two.

In one or more aspects, the phrases "one or more among" and "one or more of" can be used interchangeably simply for convenience unless stated otherwise.

The term "or" means "inclusive or" rather than "exclusive or." For example, unless otherwise stated or clear from the context, the expression that "x uses a or b" means any one of natural inclusive permutations. For example, "a or b" can mean "a," "b," or "a and b." For example, "a, b or c" can mean "a," "b," "c," "a and b," "b and c," "a and c," or "a, b and c."

Features of various aspects of the present disclosure can be partially or entirety coupled to or combined with each other, can be technically associated with each other, and can be variously inter-operated, linked or driven together. The aspects of the present disclosure can be implemented or carried out independently of each other, or can be implemented or carried out together in a co-dependent or related relationship. In one or more aspects, the components of each apparatus according to various aspects of the present disclosure are operatively coupled and configured.

Unless otherwise defined, all terms including technical and scientific terms used herein have the same meaning as commonly understood by one of ordinary skill in the art to example aspects belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used in the description below have been selected as being general and universal in the related technical field. However, there can be other terms than the terms depending on the development and/or change of technology, convention, preference of technicians, etc. Therefore, the terms used in the description below should not be understood as limiting technical ideas, but should be understood as examples of the terms for illustrating aspects.

Further, in a specific case, a term can be arbitrarily selected by the applicant, and in this case, the detailed meaning thereof will be described in a corresponding description herein. Therefore, the terms used herein should be understood based on not only the name of the terms, but the meaning of the terms and the content thereof.

Hereinafter, a display apparatus according to each aspect of the present disclosure will be described with reference to the attached drawings. All components of each display apparatus or device according to all embodiments of the present disclosure are operatively coupled and configured.

FIG. 1 illustrates a plan view of a display apparatus 100 according to an aspect of the present disclosure. In FIG. 1, for convenience of illustration, a wiring substrate M-SUB, a plurality of link lines LL1 and LL2, a plurality of circuit films 110*a* and 110*b* on which integrated circuit chips are disposed, respectively, a plurality of printed circuit boards 115*a* and 115*b*, and a display part TU among components of the display apparatus 100 are shown.

Referring to FIG. 1, the display apparatus 100 according to an aspect of the present disclosure can include the wiring substrate M-SUB and the display part TU disposed on the wiring substrate M-SUB. The wiring substrate M-SUB can include glass or transparent plastic.

The plurality of link lines LL1 and LL2 can be disposed on the wiring substrate M-SUB. The plurality of link lines LL1 and LL2 can extend along one direction of the wiring substrate M-SUB. For example, the plurality of link lines LL1 and LL2 can extend along a Y-axis direction as a column direction of the wiring substrate M-SUB.

A driver including the circuit films 110*a* and 110*b* on which the integrated circuit chips are disposed, respectively, and the printed circuit boards 115*a* and 115*b* respectively connected thereto can be disposed on an end (or a portion) of at least one side of the wiring substrate M-SUB. The integrated circuit chips can transmit various signals to the sub-pixels disposed in each display part or the wiring substrate M-SUB. The circuit films 110*a* and 110*b* are connected to an end of the link line LL. For example, the signals transmitted to the sub-pixels can include high-potential voltage (Vdd), low-potential voltage (Vss), a scan signal, or a data signal. In an aspect of the present disclosure, an example in which the driver including the circuit films 110*a* and 110*b* on which the integrated circuit chips are disposed, respectively, and the printed circuit boards 115*a* and 115*b* respectively connected thereto can be disposed on each of both ends (or both portions) of the wiring substrate M-SUB is illustrated.

The printed circuit boards 115*a* and 115*b* can include the first printed circuit board 115*a* disposed on one end (or one portion) of the wiring substrate M-SUB and the second printed circuit board 115*b* disposed on the other end or on another end (or the other portion or another portion) of the wiring substrate M-SUB.

The plurality of link lines LL1 and LL2 can include a plurality of first link lines LL1 connected to the first printed circuit board 115*a* and a plurality of second link lines LL2 connected to the second printed circuit board 115*b*. The first link line LL1 and the second link line LL2 can receive the various signals transmitted from the first printed circuit board 115*a* and the second printed circuit board 115*b*, respectively, and can transmit the various signals to a plurality of signal lines disposed in the display part TU. For example, the signal lines can include a high-potential voltage line, a low-potential voltage line, a scan line, and a data line, but aspects of the present disclosure are not limited thereto.

The display part TU disposed on the wiring substrate M-SUB can be connected to the wiring substrate M-SUB by electrical connection between the plurality of signal lines and the plurality of first and second link lines LL1 and LL2 disposed on the wiring substrate M-SUB. Thus, the plurality of first and second link lines LL1 and LL2 can be disposed to overlap the display part TU so as not to be exposed to an outside. Accordingly, a size of the circuit area where the first and second plurality of link lines LL1 and LL2 are disposed can be reduced, thereby increasing a display area.

A plurality of pixels can be disposed in the display part TU disposed on the wiring substrate M-SUB. A light-emitting element and a driving circuit including a transistor configured to drive the light-emitting element can be disposed in each of the plurality of pixels.

Hereinafter, with reference to FIG. 2, one sub-pixel among the plurality of sub-pixels disposed in the display part will be described as an example. Each sub-pixel of the display apparatus 100 can have the sub-pixel configuration of FIG. 2. For example, FIG. 2 is a cross-sectional view of an area 2 in FIG. 1 and each of the sub-pixels can include the same configuration.

Figure 2:
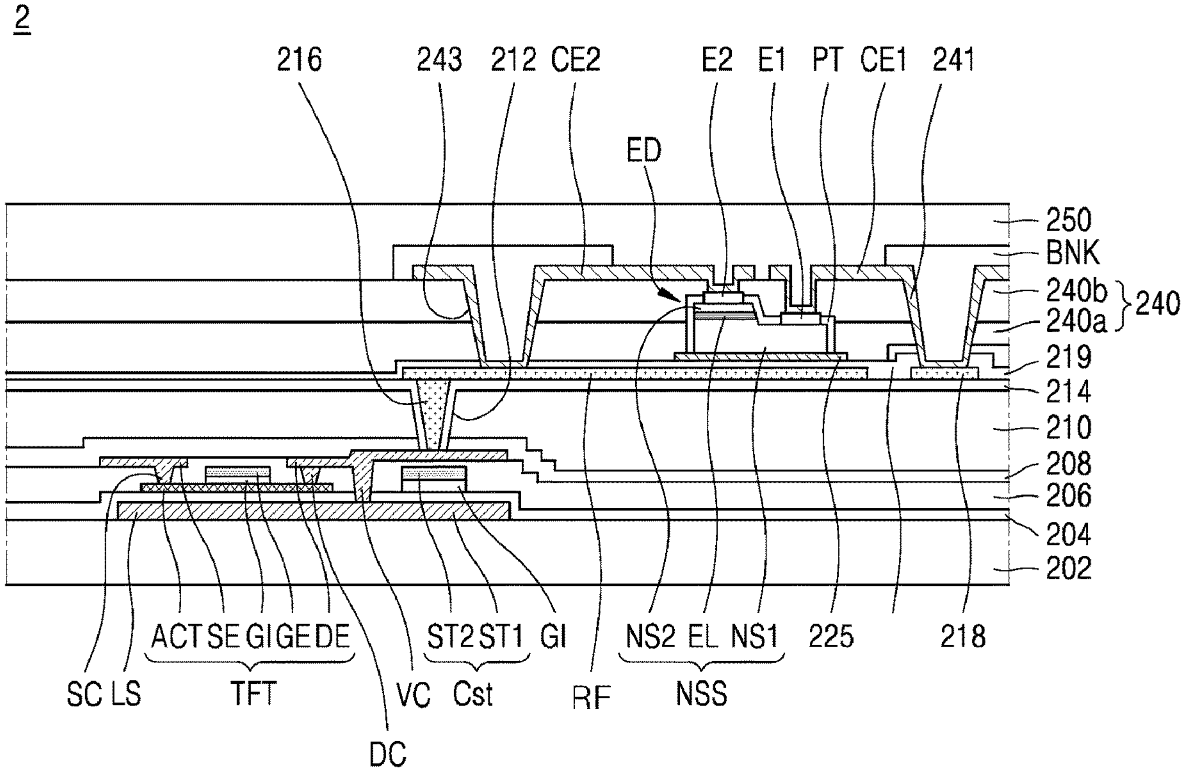
FIG. 2 is a cross-sectional view of an area 2 in FIG. 1.

Referring to FIG. 2, one sub-pixel according to an aspect of the present disclosure can include a base substrate 202 of the display part, and a thin-film transistor TFT, a storage capacitor Cst, and various lines disposed on the base substrate 202 of the display part. The thin-film transistor TFT can drive the light-emitting element ED. The storage capacitor Cst can store therein voltage so that the light-emitting element ED is maintained in the same state for one frame.

A light-blocking layer LS can be disposed on the base substrate 202. The light-blocking layer LS can reduce a leakage current by preventing light incident from a position under the base substrate 202 from being incident to a semiconductor layer ACT (or an active layer) of the plurality of thin-film transistors. For example, the light-blocking layer LS can be disposed under the semiconductor layer ACT of the thin-film transistor TFT that functions as a driving transistor to prevent the light from being incident on the active layer ACT.

A buffer layer 204 can be disposed on the light-blocking layer LS. The buffer layer 204 can prevent impurities or moisture penetrating through the base substrate 202 from invading the thin-film transistor TFT. The buffer layer 204 can include an insulating material such as silicon oxide (SiOx) or silicon nitride (SiNx).

The thin-film transistor TFT can be disposed on the buffer layer 204. The thin-film transistor TFT can include the semiconductor layer ACT, a gate electrode GE, a source electrode SE, and a drain electrode DE. A gate insulating layer GI can be disposed between the semiconductor layer ACT and the gate electrode GE.

The semiconductor layer ACT can include an active area (or a channel area) that overlaps the gate electrode GE to form a channel, and a source area and a drain area respectively positioned on both sides (or both portions) of the active area. A first interlayer insulating film 206 can be disposed on the gate electrode GE. The first interlayer insulating film 206 can receive therein a source contact SC and a drain contact DC. The source contact SC and drain contact DC can respectively contact portions of surfaces of the source area and the drain area of the semiconductor layer ACT. The source contact SC and the drain contact DC can be respectively electrically connected to the source electrode SE and the drain electrode DE disposed on an upper surface of the first interlayer insulating film 206 and electrically connected to the source and drain areas of the semiconductor layer ACT, respectively.

The storage capacitor Cst can include a first capacitor electrode ST1 and a second capacitor electrode ST2. The first capacitor electrode ST1 can be disposed between the base substrate 202 and the buffer layer 204. The first capacitor electrode ST1 can be integrated with the light-blocking layer LS. A combination of the buffer layer 204 and the gate insulating layer GI can act as a dielectric layer of the storage capacitor Cst on the first capacitor electrode ST1. The second capacitor electrode ST2 can be disposed on the gate insulating layer GI. The second capacitor electrode ST2 can be formed of a same material as that of the gate electrode GE.

A first passivation layer 208 can be disposed on the source electrode SE and the drain electrode DE. The first passivation layer 208 can serve to protect the thin-film transistor TFT and can include an insulating material. A first planarization layer 210 is disposed on the first passivation layer 208. The first planarization layer 210 serves to planarize a surface step caused by an underlying element such as the thin-film transistor TFT. The first planarization layer 210 can include a photoactive compound (PAC). However, aspects of the present disclosure are not limited thereto.

The first planarization layer 210 can receive therein a contact hole 212 exposing a portion of a surface of the drain electrode DE. A second passivation layer 214 can be disposed on the first planarization layer 210 and along a side surface of the contact hole 212. A via contact 216 can be disposed to fill the contact hole 212.

A reflective electrode RF connected to the via contact 216 can be disposed on the second passivation layer 214. The reflective electrode RF reflects light emitted from the light-emitting element toward the base substrate 202 so as to be directed out of the display area. The reflective electrode RF can include a highly reflective metal material. For example, the metal material with high reflectivity can include aluminum (Al), copper (Cu), silver (Ag), molybdenum (Mo), gold (Au), magnesium (Mg), calcium (Ca), or barium (Ba). The reflective electrode RF can include a single-layer structure or a stack structure formed of one of aluminum (Al), copper (Cu), silver (Ag), molybdenum (Mo), gold (Au), magnesium (Mg), calcium (Ca), or barium (Ba) or an alloy material of at least two thereof.

The drain electrode DE connected to the reflective electrode RF and the via contact 216 can be electrically connected to the light-blocking layer LS by a through-electrode VC extending through the interlayer insulating film 206 and the buffer layer 204.

The reflective electrode RF and a signal line 218 can be disposed on a same plane. The signal line 218 can include a plurality of signal lines. For example, the plurality of signal lines can include a plurality of scan lines, a plurality of high-potential voltage (Vdd) lines, a plurality of data lines, and a plurality of reference voltage lines. The plurality of signal lines can be disposed on a same plane of the base substrate 202. Furthermore, the plurality of signal lines can be formed of a same material as that of the reflective electrode RF.

A third passivation layer 219 can be disposed so as not to cover a portion of an upper surface of each of the reflective electrode RF and the signal line 218 so as to be exposed. An adhesive layer 225 can be disposed on the third passivation layer 219. The adhesive layer 225 can serve to adhere the light-emitting element ED to the third passivation layer 219. The adhesive layer 225 can be formed of a heat-curable material or a photo-curable material. However, aspects of the present disclosure are not limited thereto.

The light-emitting element ED can be disposed on the adhesive layer 225. The light-emitting element ED according to an aspect of the present disclosure can be embodied as a micro-LED. The micro-LED can be an LED formed of an inorganic material and can refer to a light-emitting element of 100 μm or smaller. Furthermore, in an aspect of the present disclosure, an example in which the micro-LED is embodied as a horizontal micro-LED is described. However, aspects of the present disclosure are not limited thereto. For example, the light-emitting element can be embodied as a vertical micro-LED, a flip chip-shaped micro-LED, or a nanorod-shaped micro-LED.

The light-emitting element ED can include a nitride semiconductor structure NSS, a first electrode E1, and a second electrode E2. The nitride semiconductor structure NSS can include a first semiconductor layer NS1, an active layer EL disposed in one side (or one portion) of the first semiconductor layer NS1, and the second semiconductor layer NS2 disposed on the active layer EL. The first electrode E1 can be disposed on the first semiconductor layer NS1 where the active layer EL is not disposed, and the second electrode E2 can be disposed on the second semiconductor layer NS2.

The first semiconductor layer NS1 can be a layer for supplying electrons to the active layer EL and can include a nitride semiconductor having first conductivity type impurity. For example, the first conductivity type impurity can include N type impurity. The active layer EL disposed on one side (or one portion) of the first semiconductor layer NS1 can include a multi quantum well (MQW) structure. The second semiconductor layer NS2 can be a layer for injecting holes into the active layer EL. The second semiconductor layer NS2 can include a nitride semiconductor having second conductivity type impurity. For example, the second conductivity type impurity can include P type impurity.

A protective-layer pattern PT can cover an outer surface of the light-emitting element ED. The protective-layer pattern PT can serve to improve the characteristics of the element by preventing damage that can occur to a side portion of the nitride semiconductor structure NSS during a dry etching process to form the nitride semiconductor structure NSS.

The light-emitting element ED can be covered with an upper planarization layer 240. The upper planarization layer 240 can have a sufficient thickness to planarize an upper surface having steps caused due to underlying circuit elements. The upper planarization layer 240 can include a structure in which a second planarization layer 240*a* and a third planarization layer 240*b* are stacked. The upper planarization layer 240 can have opening holes 243 and 241 therein that expose portions of the surfaces of the reflective electrode RF and the signal line 218, respectively. The opening holes 241 and 243 can include the first opening hole 241 extending through the upper planarization layer 240 so as to expose the portion of the surface of the signal line 218 and the second opening hole 243 extending through the upper planarization layer 240 so as to expose the portion of the surface of the reflective electrode RF. Furthermore, the upper planarization layer 240 can expose a portion of an upper surface of each of the first electrode E1 and the second electrode E2 of the light-emitting element ED. The first electrode E1 and the second electrode E2 can be electrically connected to a first line electrode CE1 and a second line electrode CE2, respectively.

The first line electrode CE1 can extend to an exposed surface of the first opening hole 241. The second line electrode CE2 can extend to an exposed surface of the second opening hole 243. The first line electrode CE1 can be electrically connected to the signal line 218. The second line electrode CE2 can be electrically connected to the drain electrode DE by the reflective electrode RF.

The first line electrode CE1 and the second line electrode CE2 can be disposed in a same layer and formed of a same conductive material. In one example, each of the first line electrode CE1 and the second line electrode CE2 can include a transparent metal oxide such as indium-tin-oxide (ITO) or indium-zinc-oxide (IZO).

A bank BNK can be disposed on the upper planarization layer 240. The bank BNK can include an opaque material. However, aspects of the present disclosure are not limited thereto. The first opening hole 241 and the second opening hole 243 can be filled with a material constituting the bank BNK. Furthermore, the bank BNK can be disposed in a periphery area around the light-emitting element ED excluding an area where the light-emitting element ED is disposed. A protective layer 250 can be disposed on the upper planarization layer 240 including the bank BNK. The protective layer 250 can prevent impurities from penetrating into the light-emitting element ED.

To transmit the various signals output from the first and second printed circuit boards 115*a* and 115*b* respectively disposed on both opposing ends of the wiring substrate M-SUB to the sub-pixels of the display part TU, the wiring substrate M-SUB and the display part TU should be electrically connected to each other. In one scheme that electrically connects the wiring substrate M-SUB and the display part TU to each other, the link line LL of the wiring substrate M-SUB can be electrically connected to the display part TU by a through-electrode extending through the display part TU. However, in this scheme, it is difficult to etch a through-hole extending through the display part TU, form the through-electrode to fill the through hole, and connect the through-electrode to the wiring substrate M-SUB. Further, in this scheme, there is a difficulty in carrying out a process to form the thin-film transistor in the display part TU in which the through-hole has been formed.

Furthermore, another scheme to electrically connect the wiring substrate M-SUB and the display part TU to each other is to electrically connect the wiring substrate M-SUB and the display part TU to each other by a conductive contact member disposed therebetween. However, when a defect in the conductive contact member occurs after bonding (or attaching) the wiring substrate and the display part to each other, it is difficult to repair the conductive contact member.

Accordingly, aspects of the present disclosure can propose a configuration for electrically connecting the wiring substrate M-SUB and the display part TU to each other.

Figure 3:
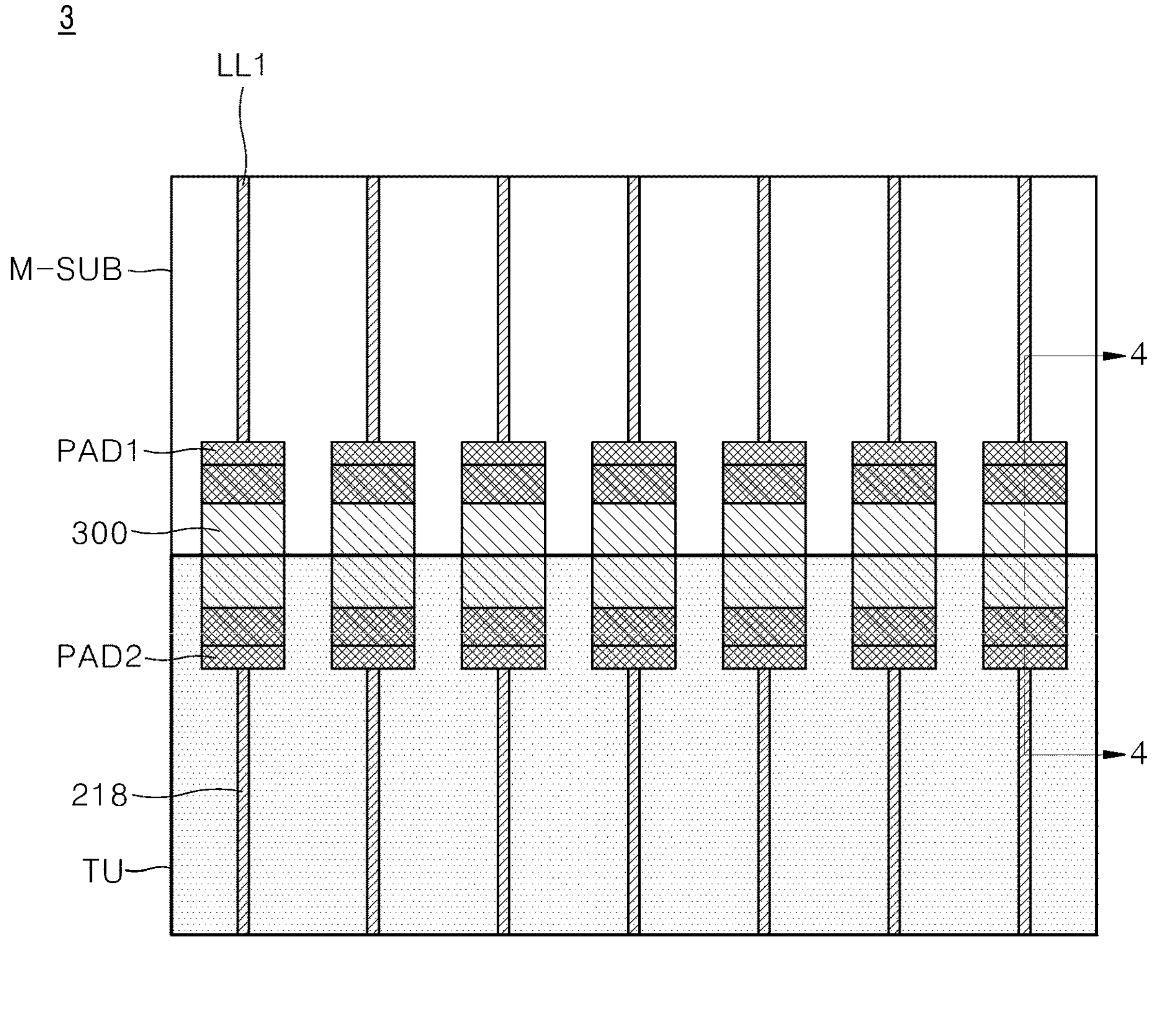
FIG. 3 is a schematic enlarged plan view of an area 3 in FIG. 1.
Figure 4:
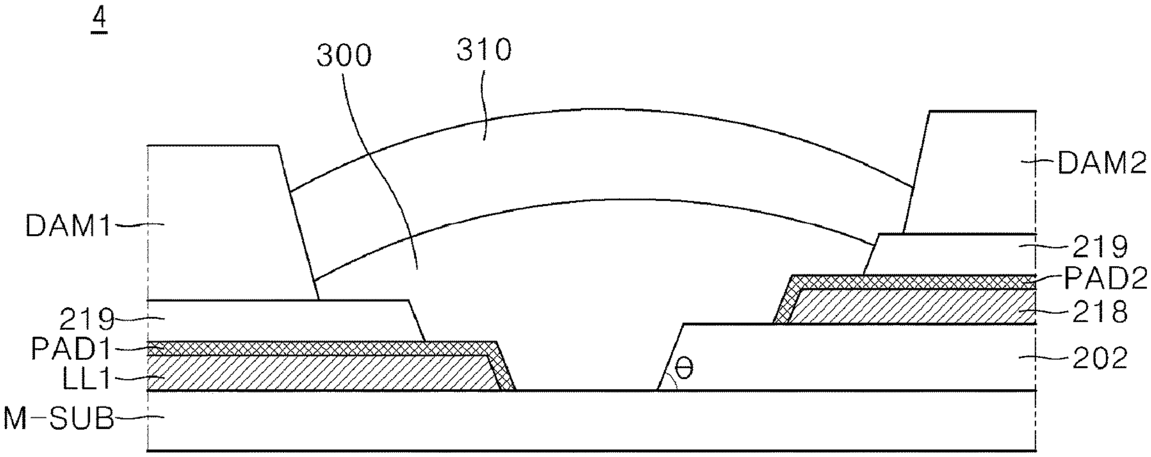
FIG. 4 is a cross-sectional view of an area 4 in FIG. 3.

FIG. 3 illustrates an enlarged plan view of an area 3 in FIG. 1. FIG. 4 is a cross-sectional view of an area 4 in FIG. 3. In FIG. 3, for convenience of illustration, the plurality of first link lines LL1, a first pad electrode PAD1, a first conductive pattern 300, a second pad electrode PAD2, and the signal line 218 among components of the wiring substrate M-SUB and the display part TU are illustrated.

Referring to FIG. 3 and FIG. 4, the display part TU can be bonded (or attached) to the wiring substrate M-SUB by an adhesive. The first link line LL1 to transmit signals to the display part TU can be disposed on the wiring substrate M-SUB. The first link line LL1 can include a metallic material or indium-tin-oxide (ITO). An end of the first link line LL1 can be covered with the first pad electrode PAD1. Accordingly, each of the first link lines LL1 can be disposed in a corresponding manner to each of the first pad electrodes PAD1.

The signal line 218 connected to the sub-pixels and extending toward an edge of the display part TU can be disposed in the display part TU. The signal line 218 can include a metallic material or indium-tin-oxide (ITO). An end of the signal line 218 can be covered with the second pad electrode PAD2. For example, the first pad electrode PAD1 and the second pad electrode PAD2 can be formed of a same material. The first link line LL1 disposed on the wiring substrate M-SUB and the signal line 218 disposed in the display part TU can be disposed so as to face each other. A resolution of the display apparatus can be adjusted based on a spacing between neighboring first pad electrodes PAD1 or a spacing (or a distance or an interval) between neighboring second pad electrodes PAD2.

The third passivation layer 219 can be disposed on each of the first pad electrode PAD1 and the second pad electrode PAD2. The third passivation layer 219 can include an inorganic insulating material. The third passivation layer 219 can expose a portion of a surface of the first pad electrode PAD1 and the second pad electrode PAD2. Accordingly, an end of the third passivation layer 219 can be disposed inwardly of an end of each of the first pad electrode PAD1 and the second pad electrode PAD2.

Further, dams DAM1 and DAM2 can be disposed on the third passivation layer 219. The dams DAM1 and DAM2 can include a first dam DAM1 disposed on the third passivation layer 219 of the first link line LL1 of the wiring substrate M-SUB and a second dam DAM2 disposed on the third passivation layer 219 of the display part TU. The first dam DAM1 and the second dam DAM2 can have a sufficient height to prevent a material of an organic insulating layer as a conductive-pattern protection layer from overflowing into the sub-pixel.

Furthermore, the first dam DAM1 and the second dam DAM2 can expose portions of the surfaces of the first pad electrode PAD1 and the second pad electrode PAD2. Accordingly, ends of the first dam DAM1 and the second dam DAM2 can be disposed inwardly of the ends of the first pad electrode PAD1 and the second pad electrode PAD2, respectively. Furthermore, the ends of the first dam DAM1 and the second dam DAM2 can be disposed inwardly of the ends of the portions of the third passivation layer 219. Accordingly, a portion of an upper surface and a side surface of the end of the third passivation layer 219 can be exposed.

The plurality of first pad electrodes PAD1 can be spaced apart from each other by a predetermined distance (or spacing or interval). The plurality of second pad electrodes PAD2 can be spaced apart from each other by a predetermined distance (or spacing or interval). Referring back to FIG. 3, the plurality of first pad electrodes PAD1 can be arranged in the row direction of the wiring substrate M-SUB. The plurality of second pad electrodes PAD2 can be arranged in the row direction of the wiring substrate M-SUB. Furthermore, a portion of the upper surface and the side surface of the end of the first pad electrode PAD1 can be exposed. A portion of the upper surface and the side surface of the end of the second pad electrode PAD2 can be exposed.

The exposed surfaces of the first pad electrode PAD1 and the second pad electrode PAD2 can be covered with the first conductive pattern 300. The first conductive pattern 300 can be disposed to partially overlap the first pad electrode PAD1 and the second pad electrode PAD2 disposed in a corresponding manner to each other in the column direction of the wiring substrate M-SUB. The first conductive pattern 300 according to an aspect of the present disclosure can include a silver (Ag) ink layer applied in an inkjet method. The first conductive pattern 300 can have a thickness sufficient to cover the exposed surfaces of the first pad electrode PAD1 and the second pad electrode PAD2 and the exposed surface of the third passivation layer 219.

The first conductive pattern 300 can be covered with a first electrode protection layer 310. The first electrode protection layer 310 can include a black ink or organic ink protective-layer.

An edge (or a periphery) of the display part TU can be subjected to grinding such that an edge (or a periphery) of the base substrate 202 has an inclined surface inclined at a predetermined angle θ with respect to a flat upper surface of the wiring substrate M-SUB to reduce a step along a height of the base substrate 202 of the display part TU. When the edge of the base substrate 202 of the display part TU has a surface of 90 degrees with respect to the flat upper surface of the wiring substrate M-SUB, disconnection of the first conductive pattern 300 can occur at the edge of the base substrate 202 of the display part TU. Thus, the edge of the base substrate 202 of the display part TU has the inclined surface.

The wiring substrate M-SUB and the display part TU can be electrically connected to each other by the first conductive pattern 300 disposed so as to overlap the exposed surfaces of the first pad electrode PAD1 and the second pad electrode PAD2.

In a method of checking the electrical connection between the first pad electrode PAD1 and the second pad electrode PAD2, a test can be conducted to check whether a signal communicates between the first printed circuit board 115*a* and the second printed circuit board 115*b*.

When the first printed circuit board 115*a* and the second printed circuit board 115*b* do not exchange the signal with each other, the connection is recognized as being defective. In response thereto, a repair process can be performed by removing the defective first conductive pattern 300 between the first pad electrode PAD1 and the second pad electrode PAD2 in the area, and again forming a normal first conductive pattern 300 between the first pad electrode PAD1 and the second pad electrode PAD2. Accordingly, when the defect occurs in the first conductive pattern 300, the defective first conductive pattern 300 can be removed, and then, silver (Ag) can be applied into the removal area again by an inkjet method. Thus, the repair process can be easy.

Figure 5:
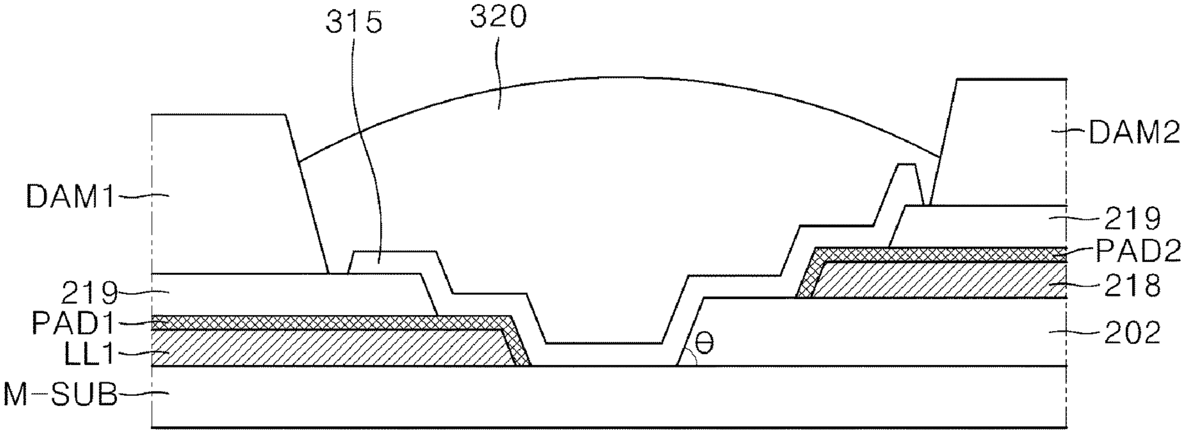
FIG. 5 is a cross-sectional view showing a connection area between a wiring substrate and a display part according to another aspect of the present disclosure.

FIG. 5 is a cross-sectional view showing the connection area between the wiring substrate and the display part according to another aspect of the present disclosure. The connection area between the wiring substrate and the display part according to FIG. 5 is substantially the same as that of FIG. 3 and FIG. 4 except for a configuration of a conductive pattern. Thus, the same components can be briefly described or descriptions thereof can be omitted.

Referring to FIG. 5, the first link line LL1 or the second link line LL2 a can be disposed on the wiring substrate M-SUB, and an end of each of the first link line LL1 or the second link line LL2 can be covered with the first pad electrode PAD1.

The signal line 218 can be disposed on the display part TU. An end of the signal line 218 can be covered with the second pad electrode PAD2. For example, the first pad electrode PAD1 and the second pad electrode PAD2 can be formed of a same material. The first link line LL1 disposed on the wiring substrate M-SUB and the signal line 218 disposed on the display part TU can be disposed so as to face each other.

The third passivation layer 219 can be disposed on each of the first pad electrode PAD1 and the second pad electrode PAD2. The third passivation layer 219 can expose a portion of a surface of each of the first pad electrode PAD1 and the second pad electrode PAD2.

The dams DAM1 and DAM2 can be disposed on the third passivation layer 219 of the wiring substrate M-SUB. The dams DAM1 and DAM2 can include a first dam DAM1 disposed on the third passivation layer 219 on the first link line LL1 of the wiring substrate M-SUB and a second dam DAM1 disposed on the third passivation layer 219 of the display part TU.

The exposed surfaces of the first pad electrode PAD1 and the second pad electrode PAD2 can be covered with a second conductive pattern 315. The second conductive pattern 315 can be disposed to partially overlap the first pad electrode PAD1 and the second pad electrode PAD2 disposed in a corresponding manner to each other in the column direction of the wiring substrate M-SUB. The second conductive pattern 315 according to an aspect of the present disclosure can be formed by printing method using a pad coated with a conductive material. The conductive material can include a silver (Ag) paste, but is not limited thereto, and any material including conductivity can be applied.

A second conductive pattern 315 can conformally extend along the exposed from an upper surface of the third passivation layer 219 to a side surface of the third passivation layer 219, can contact and can be electrically connected to the first pad electrode PAD1 and the second pad electrode PAD1. The second conductive pattern 315 can be disposed along the inclined surface of the base substrate 202 of the display part TU. The end portion of the base substrate 202 can include an inclined surface inclined at a predetermined angle θ with respect to a flat upper surface of the wiring substrate M-SUB. Accordingly, the second conductive pattern 315 can be prevented from being disconnected at the end portion of the base substrate 202.

The second conductive pattern 315 can be covered with a second electrode protection layer 320. The second electrode protection layer 320 can include a black ink or organic ink protective-layer.

Figure 6:
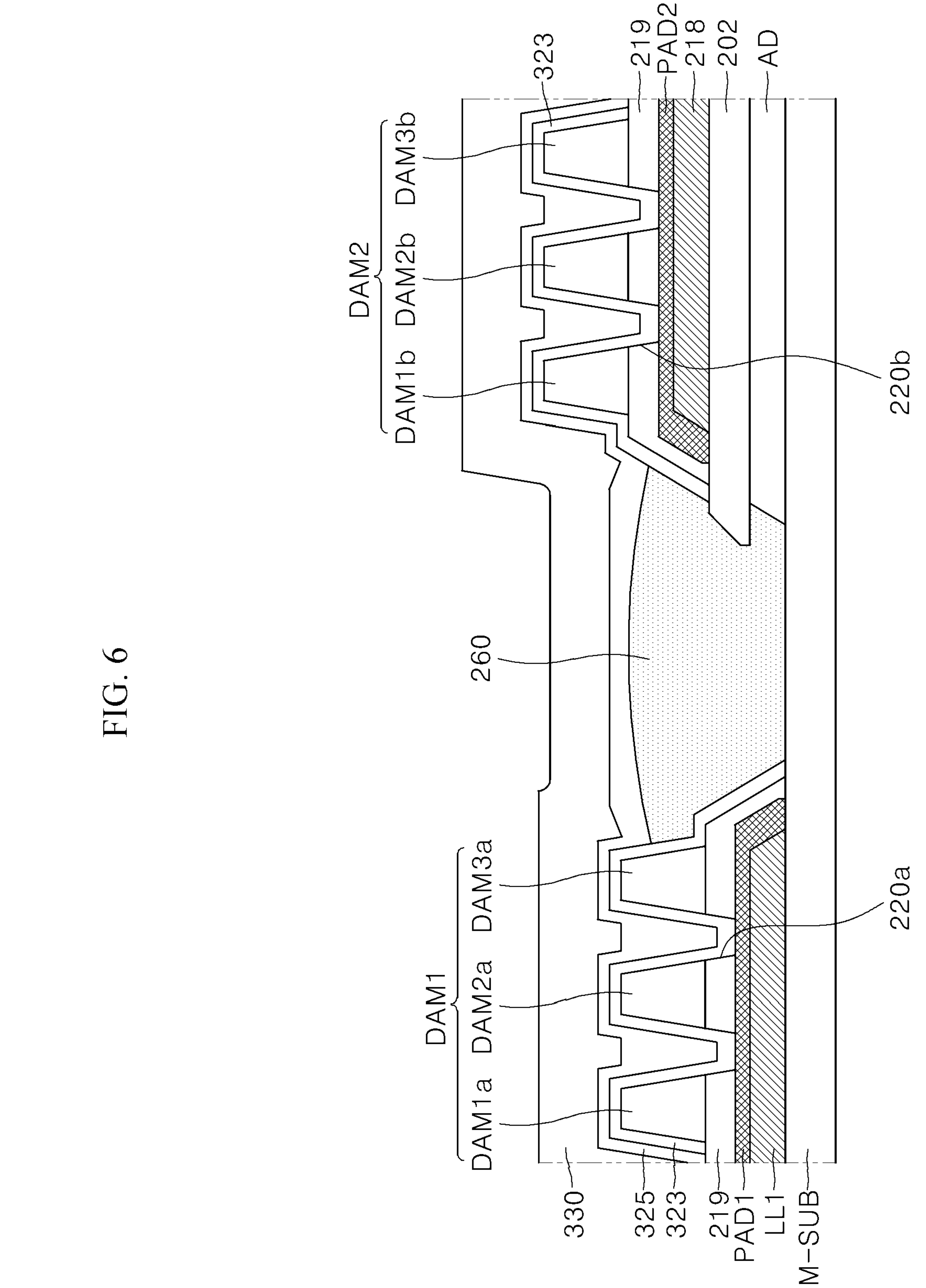
FIG. 6 is a cross-sectional view showing a connection area between a wiring substrate and a display part according to another aspect of the present disclosure.

FIG. 6 is a cross-sectional view illustrating a connection area between the wiring substrate and the display part according to still another aspect of the present disclosure. In FIG. 6, the components that are substantially the same as those in FIG. 3 and FIG. 4 can be briefly described or the descriptions thereof can be omitted.

When the display part TU is bonded (or attached) to the wiring substrate M-SUB by the adhesive, a spacing (or a distance or an interval) between the display part TU and the wiring substrate M-SUB can occur depending on a thickness of the adhesive AD. Furthermore, the spacing (or the distance or the interval) can occur during a process of grinding the edge (or the periphery) of the base substrate of the display part TU. When the spacing (or the distance or the interval) occurs, a step can occur between the display part TU and the wiring substrate M-SUB.

For example, the second pad electrode PAD2 disposed on the signal line 218 of the display part TU can be disposed at a second vertical level (or a second position) higher than a first vertical level (or a first position) of the first pad electrode PAD1 disposed on the first link line LL1 of the wiring substrate M-SUB due to the step between the wiring substrate M-SUB and the base substrate 202 of the display part TU. A difference height between the first and second pad electrodes PAD1 and PAD2 can vary based on a thickness of the adhesive AD and/or a thickness of the base substrate 202 including an inclined angle of an inclined surface of a periphery portion of the grinded display part (TU). When the first pad electrode PAD1 and the second pad electrode PAD2 are electrically connected to each other by a conductive member while the first pad electrode PAD1 and the second pad electrode PAD2 are disposed at different vertical levels (or different height), the disconnection of the conductive member can occur at the step area.

Accordingly, in another aspect of the present disclosure, the first pad electrode PAD1 and the second pad electrode PAD2 can be stably electrically connected to each other even when the first pad electrode PAD1 and the second pad electrode PAD2 are disposed at different height (or vertical levels).

Referring to FIG. 6, the display part TU is bonded to the wiring substrate M-SUB by the adhesive AD. The first link line LL1 to transmit the signal to the display part TU can be disposed on the wiring substrate M-SUB. The end of the first link line LL1 can be covered with the first pad electrode PAD1.

The signal line 218 connected to the sub-pixels and extending toward the edge (or the periphery) of the display part TU can be disposed on the display part TU. The end of the signal line 218 can be covered with the second pad electrode PAD2. The first pad electrode PAD1 disposed on the first link line LL1 of the wiring substrate M-SUB and the second pad electrode PAD2 disposed on the signal line 218 of the display part TU can be positioned at different vertical levels (or different height) due to the thickness of the adhesive AD disposed between the wiring substrate M-SUB and the base substrate 202.

The third passivation layer 219 can be disposed on the first pad electrode PAD1 and the second pad electrode PAD2. The third passivation layer 219 can include an inorganic insulating material. The third passivation layer 219 can have a plurality of open holes 220*a* and 220*b*, exposing at least one or more a portion of the upper surface of the first pad electrode PAD1 and the second pad electrode PAD2. The plurality of open holes 220*a* and 220*b* can include a first open hole 220*a* exposing the upper surface of the first pad electrode PAD1 disposed on the wiring substrate M-SUB, and a second open hole 220*b* exposing at least a portion of the upper surface of the second pad electrode PAD2 disposed on the display part TU.

The third passivation layer 219 having the plurality of open holes 220*a* and 220*b* can be disposed to cover the end of each of the first pad electrode PAD1 and the second pad electrode PAD2 without exposing them.

Further, dams DAM1 and DAM2 can be disposed on the third passivation layer 219. The dams DAM1 and DAM2 can include a first dam DAM1 disposed on the third passivation layer 219 of the wiring substrate M-SUB and a second dam DAM2 disposed on the third passivation layer 219 of the display part TU.

The first dam DAM1 can include a plurality of dam patterns including a first dam pattern DAM1*a*, a second dam pattern DAM2*a* and a third dam pattern DAM3*a* disposed on the third passivation layer 219 so as to expose the first open holes 220*a*. The second dam DAM2 can include a plurality of dam patterns including a fourth dam pattern DAM1*b*, a fifth dam pattern DAM2*b*, and a sixth dam pattern DAM3*b* disposed on the third passivation layer 219 so as to expose the second open holes 220*b*. In an aspect of the present disclosure, an example in which each of the first and second dams respectively disposed on the wiring substrate M-SUB and the display part TU has three dam patterns is illustrated for convenience of illustration. However, the number of dam patterns is not limited thereto.

A first connection electrode 323 can be formed along a profile of the first dam DAM1 so as to be in contact with the first pad electrode PAD1 exposed through the first open hole 220*a*. A second connection electrode 323 can be formed along a profile of the second dam DAM2 so as to contact with the second pad electrode PAD2 exposed through the second open hole 220*b*. The first and second connection electrodes 323 can include a conductive material or a metal material that is electrically conductive.

A step reducing layer 260 can be disposed between the first pad electrode PAD1 and the second pad electrode PAD2. The step reducing layer 260 serves to reduce the step between the first pad electrode PAD1 disposed at a first position and the second pad electrode PAD2 disposed at a second position which is relatively higher than the first position. The step reducing layer 260 can include an organic insulating material. The step reducing layer 260 can be a layer, but aspects of the present disclosure are not limited thereto.

A third conductive pattern 325 can be disposed so as to be in contact with the step reducing layer 260 and the first and second connection electrodes 323. The third conductive pattern 325 can be formed by printing using a pad coated with a conductive material. The conductive material can include silver (Ag) paste, but aspects of the present disclosure are not limited thereto. For example, the third conductive pattern 325 can include a silver (Ag) ink layer applied using an inkjet method. Furthermore, any material including electrical conductivity properties can be applied to form the third conductive pattern 325.

The third conductive pattern 325 can be electrically connected to the first pad electrode PAD1 and the second pad electrode PAD by the first and second connection electrodes 323, respectively. The third conductive pattern 325 can be disposed along a surface of the step reducing layer 260 reducing the step between the first pad electrode PAD1 and the second pad electrode PAD2, such that the disconnection of the third conductive pattern 325 can be prevented from occurring in the step area. The third conductive pattern 325 can be covered with a third electrode protection layer 330. The third electrode protection layer 330 can include a black ink or organic ink protective-layer.

According to an aspect of the present disclosure, a plurality of processes such as forming a through-electrode or forming a conductive contact member can be omitted by electrically connecting the wiring substrate M-SUB and the display part TU to each other by the conductive pattern, thereby realizing the process optimization and thus reducing production energy.

In one example, the link line for transmitting the signals to the display part disposed on the wiring substrate extends only in the column direction of the wiring substrate. In this case, depending on a position where the gate driver for transmitting the gate signal is disposed, transparency of the display apparatus can decrease, or an opaque area caused by the driver can be visible, or a luminance deviation can occur between the left and right sides. A scheme for solving this problem will be described below.

Figure 7:
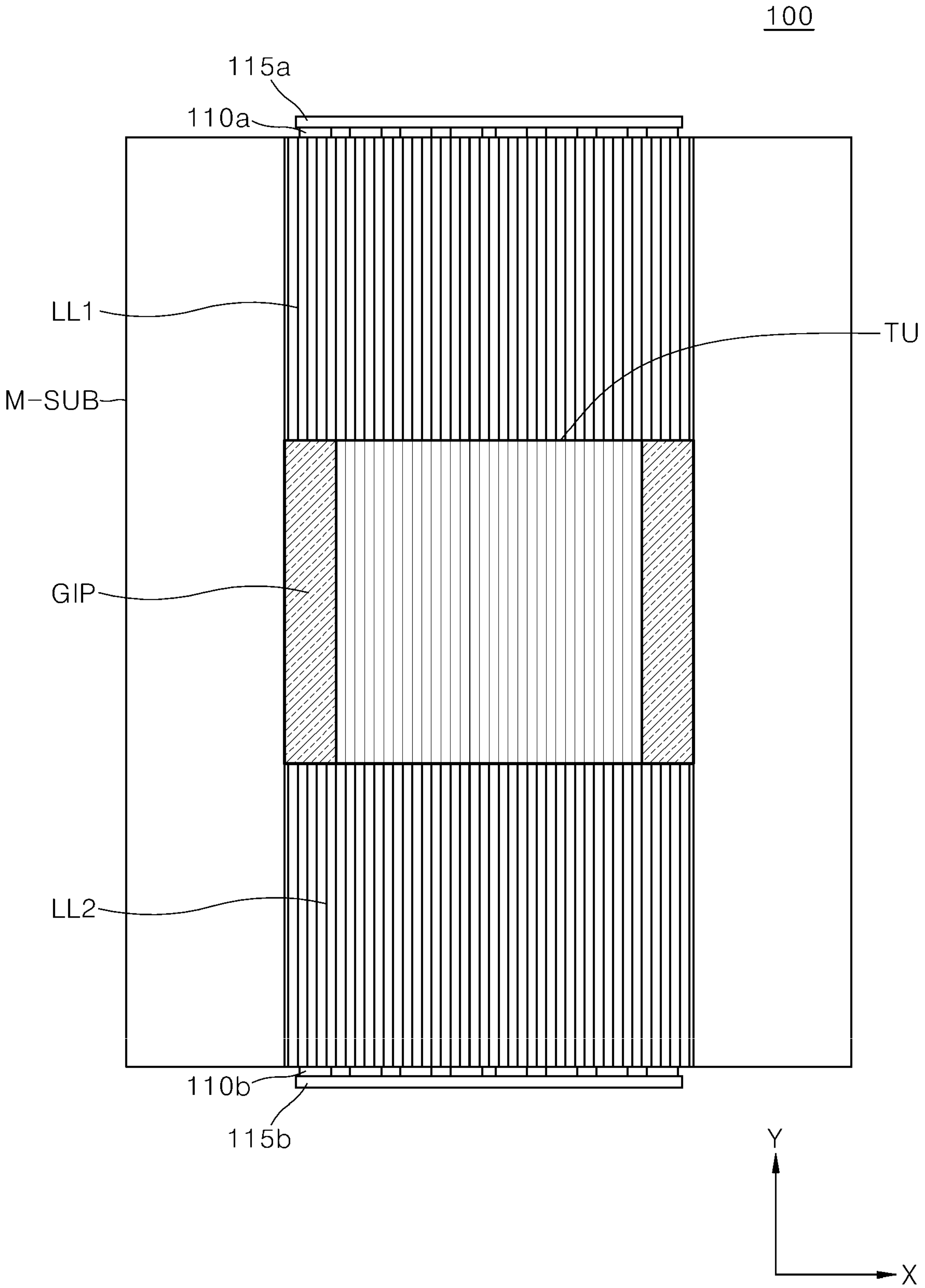
FIG. 7 and FIG. 8 illustrate plan views showing a driver of a display apparatus according to an aspect of the present disclosure.
Figure 8:
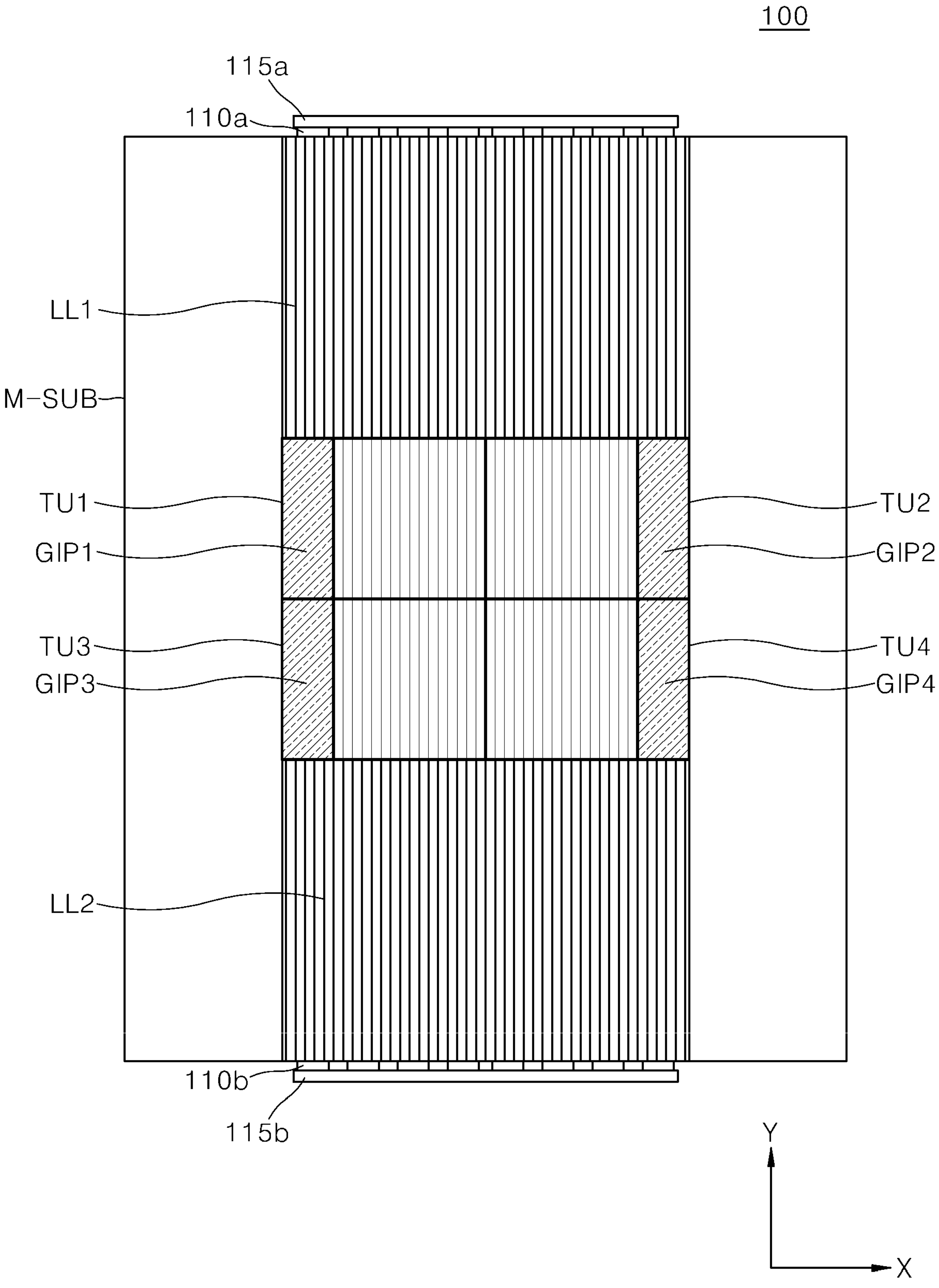

FIG. 7 and FIG. 8 illustrate plan views showing a driver of the display apparatus according to an aspect of the present disclosure.

Referring to FIG. 7, one display part TU is disposed on the wiring substrate M-SUB. The plurality of link lines LL1 and LL2 to transmit the signals to the display part TU can be disposed only in the Y-axis direction as a column direction of the wiring substrate M-SUB. When a gate driver GIP formed in a gate-in-panel (GIP) scheme in the display part TU is disposed on the display part TU, the gate driver GIP can be disposed in an area separate from the display area where the image is displayed. For example, the gate driver GIP can be disposed in an edge portion (or a periphery portion) of the display part TU outside the display area. In this case, the area where the gate driver GIP is disposed can be an opaque area. Thus, a separate aesthetic design on the opaque area can be required. The gate driver GIP and the display area can be disposed separately from each other, and only a pixel driving signal line can be disposed in the display area, such that a resolution of the display apparatus can be increased. In this regard, the pixel driving signal line can include, for example, a high-potential voltage line, a low-potential voltage line, a reference voltage line, or a data signal line, but aspects of the present disclosure are not limited thereto.

Referring to FIG. 8, a plurality of display parts TU1, TU2, TU3 and TU4 can be disposed on the wiring substrate M-SUB. The plurality of link lines LL1 and LL2 for transmitting the signals to each of the plurality of display parts TU1, TU2, TU3 and TU4 can be disposed only in the Y-axis direction which is the column direction of the wiring substrate M-SUB.

When the gate driver in the gate-in-panel (GIP) scheme is disposed in each of the plurality of display parts TU1, TU2, TU3, and TU4, the gate driver can be disposed in an area that is separate from the display area where the image is displayed. For example, each of the gate drivers GIP1, GIP2, GIP3, and GIP4 can be disposed in one side edge area (or one portion of a periphery area) outside the display area in each of the plurality of display parts TU1, TU2, TU3 and TU4. In this case, the area where each of the gate drivers GIP1, GIP2, GIP3, and GIP4 is disposed can be opaque area. Thus, the separate aesthetic design on the opaque area can be required. Furthermore, as each of the gate drivers GIP1, GIP2, GIP3, and GIP4 is disposed only at one side edge (or one portion of a periphery area) of each of the plurality of display parts TU1, TU2, TU3, and TU4, the gate signal can be provided in a single feeding manner. Thus, there is a possibility that the luminance deviation can occur between the left and right sides. Thus, it is necessary to compensate for the luminance deviation.

Alternatively, in a gate-in-array (GIA) scheme in which gate drivers arranged on a block are disposed in a pixel area, a resolution is lower than that in the gate-in-panel (GIP) scheme. Further, in the GIA approach, transparency can decrease.

Figure 9:
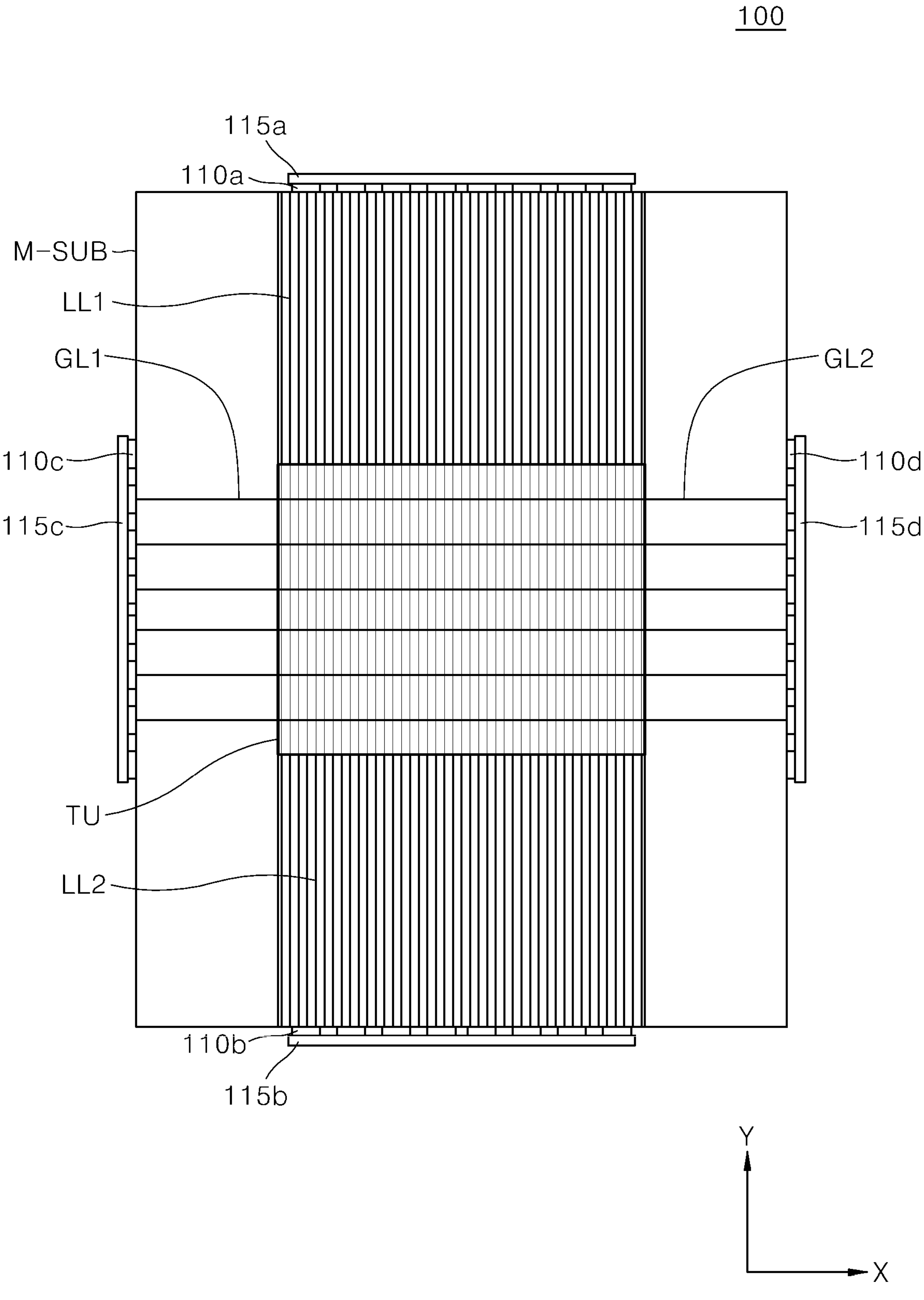
FIG. 9 illustrates a plan view of a display apparatus according to another aspect of the present disclosure.

FIG. 9 illustrates a plan view of a display apparatus according to another aspect of the present disclosure. A configuration of FIG. 9 is similar to that of FIG. 1 and FIG. 2 except for a plurality of printed circuit boards 115*c* and 115*d* disposed in a row direction of a wiring substrate M-SUB and a plurality of gate signal lines GL1 and GL2 disposed in a row direction of a wiring substrate M-SUB. Thus, the same components can be briefly described, or the descriptions thereof can be omitted.

Referring to FIG. 9, the display apparatus according to another aspect of the present disclosure can include a wiring substrate M-SUB and a display part TU disposed on the wiring substrate M-SUB.

The plurality of link lines LL1 and LL2 and the plurality of gate signal lines GL1 and GL2 can be disposed on the wiring substrate M-SUB. The plurality of link lines LL1 and LL2 can be disposed along one direction of the wiring substrate M-SUB. For example, the plurality of link lines LL1 and LL2 can be disposed along the Y-axis direction, which is the column direction of the wiring substrate M-SUB. The plurality of gate signal lines GL1 and GL2 can be disposed along the X-axis direction that intersects the Y-axis direction in which the plurality of link lines LL1 and LL2 extend.

A first driver can include circuit films 110*a* and 110*b* and printed circuit boards 115*a* and 115*b*. The circuit films 110*a* and 110*b* can be respectively disposed at both ends in the Y-axis direction as the column direction of the wiring substrate M-SUB. The circuit films 110*a* and 110*b* can be connected to ends of the plurality of link lines LL1 and LL2, respectively. The circuit films 110*a* and 110*b* on which the integrated circuit chips for transmitting various signals to each sub-pixel of the display part are mounted can be connected to the printed circuit boards 115*a* and 115*b*, respectively. The signals transmitted to the sub-pixels can include pixel driving signals, and can include, for example, the high-potential voltage, the low-potential voltage, the reference voltage, and the data signal.

A second driver can include circuit films 110*c* and 110*d* and printed circuit boards 115*c* and 115*d*. The circuit films 110*c* and 110*d* can be respectively disposed at both opposing ends in the X-axis direction as the row direction of the wiring substrate M-SUB. The circuit films 110*c* and 110*d* can be connected to ends of the plurality of gate signal lines GL1 and GL2, respectively. The circuit films 110*c* and 110*d* on which gate integrated circuit chips for transmitting the gate signals to each sub-pixel of the display part are mounted can be connected to the printed circuit boards 115*c* and 115*d*, respectively. The gate signals transmitted to each sub-pixel of the display part can include, for example, the gate signal of the thin-film transistor such as a gate line signal or an emission (EM) signal.

In another aspect of the present disclosure, a configuration is proposed in which the printed circuit boards 115*a*, 115*b*, 115*c*, and 115*d* respectively connected to the circuit films 110*a*, 110*b*, 110*c*, and 110*d* on which the integrated circuit chips are mounted are respectively disposed at four sides including both ends in the column direction of the wiring substrate M-SUB and both ends in the row direction thereof.

The printed circuit boards 115*a*, 115*b*, 115*c*, and 115*d* can include a first printed circuit board 115*a* and a second printed circuit board 115*b* respectively disposed at both ends in the Y-axis direction of the wiring substrate M-SUB, and a third printed circuit board 115*c* and a fourth printed circuit board 115*d* disposed at both ends in the X-axis direction that intersects the Y-axis direction of the wiring substrate M-SUB.

The plurality of link lines LL1 and LL2 can include a plurality of first link lines LL1 connected to the first printed circuit board 115*a* and a plurality of second link lines LL2 connected to the second printed circuit board 115*b*. The gate signal lines GL1 and GL2 can include a plurality of first gate signal lines GL1 connected to the third printed circuit board 115*c* and a plurality of second gate signal lines GL2 connected to the fourth printed circuit board 115*d*.

The display part TU disposed on the wiring substrate M-SUB can be electrically connected to the wiring substrate M-SUB by electrical connection between the plurality of signal lines 218 (see FIG. 2) and the plurality of first link lines LL1, the plurality of second link lines LL2, the first gate signal lines GL1, or the second gate signal lines GL2 disposed on the wiring substrate M-SUB.

For example, the wiring substrate M-SUB and the display part TU can be electrically connected to each other by one of the conductive patterns 300, 315, and 325 and electrode protection layers 310, 320 and 330 that electrically connecting the first pad electrode PAD1 disposed on the wiring substrate M-SUB to the second pad electrode PAD2 disposed in the display part TU as illustrated in FIG. 3 to FIG. 6.

The first pad electrode PAD1 disposed on the wiring substrate M-SUB and the second pad electrode PAD2 disposed on the display part TU can be arranged in the Y-axis direction in which each of the plurality of first link lines LL1 and a plurality of second link lines LL2 disposed. Furthermore, each of the first pad electrode PAD1 disposed on the wiring substrate M-SUB and the second pad electrode PAD2 disposed in the display part TU can be arranged in the X-axis direction in which the first gate signal line GL1 and the second gate signal line GL2 disposed. Thus, the first pad electrodes PAD1 and the second pad electrodes PAD2 can be disposed along four edges where the wiring substrate M-SUB and the display part TU overlapped.

Accordingly, the printed circuit boards 115*c* and 115*d* for transmitting the gate signal can be disposed on both ends in the X-axis direction as the row direction of the wiring substrate M-SUB. Thus, the gate driver formed in the gate-in-panel GIP scheme can be prevented from being visible to the user due to be arranged overlapping with the display part TU, wherein the gate driver formed in the gate-in-panel GIP scheme is formed on the panel together with the film transistor array disposed in the display panel. Furthermore, it can be easy to implement a high-resolution display apparatus according to the present disclosure.

A display apparatus according to some aspects of the present disclosure can also be described as follows.

A display apparatus according to some aspects of the present disclosure can comprise a wiring substrate including a plurality of link lines, a display part disposed on the wiring substrate, the display part including a plurality of light-emitting elements and a plurality of signal lines, and a first pad electrode overlapping an end of the plurality of link lines, a second pad electrode overlapping an end of the plurality of signal lines, and a conductive pattern electrically connecting to the first pad electrode and the second pad electrode.

According to some aspects of the present disclosure, the display apparatus can further comprise a first printed circuit board disposed on one end of the wiring substrate and configured to transmit a signal to the plurality of link lines, and a second printed circuit board disposed on the other end opposite to the one end of the wiring substrate so as to transmit a signal to the plurality of link lines.

According to some aspects of the present disclosure, each of the plurality of link lines can extend in a direction in which the first pad electrode of the wiring substrate and the second pad electrode of the display part are arranged in a line.

According to some aspects of the present disclosure, the conductive pattern can include silver ink or silver paste.

According to some aspects of the present disclosure, the display apparatus can further comprise a protection layer covering the conductive pattern.

According to some aspects of the present disclosure, the display apparatus can further comprise a passivation layer disposed on each of the first pad electrode and the second pad electrode. The passivation layer can include a first portion on the first pad electrode and a second portion on the second pad electrode. An end of the first portion can be disposed inwardly of an end of the first pad electrode such that a portion of a surface of the first pad electrode is exposed and an end of the second portion can be disposed inwardly of an end of the second pad electrode such that a portion of a surface of the second pad electrode is exposed. The display apparatus can further comprise dams disposed on the passivation layer of the wiring substrate and the passivation layer of the display part, respectively, the dams being disposed inwardly of an end of the passivation layer.

According to some aspects of the present disclosure, the dams can include a first dam disposed on the first portion of the passivation layer such that an end of the first dam is disposed inwardly of the end of the first portion and a second dam disposed on the second portion of the passivation layer such that an end of the second dam is disposed inwardly of the end of the second portion.

According to some aspects of the present disclosure, an end of the display part can include a base substrate having the plurality of light-emitting elements and the plurality of signal lines. An end of the base substrate can have an inclined surface inclined with respect to a flat upper surface of the wiring substrate.

According to some aspects of the present disclosure, the display apparatus can further comprise a passivation layer disposed on each of the first pad electrode and the second pad electrode, the passivation layer including a plurality of open holes exposing at least one or more of an upper surface of the first pad electrode and the second pad electrode, dams overlapping the passivation layer, the dams including a plurality of dam patterns exposing the plurality of open holes, and a layer disposed under the conductive pattern.

According to some aspects of the present disclosure, the display apparatus can further comprise a first connection electrode in contact with a portion of the first pad electrode exposed through the plurality of open holes and disposed between the first pad electrode and the conductive pattern and a second connection electrode in contact with a portion of the second pad electrode exposed through the plurality of open holes and disposed between the second pad electrode and the conductive pattern.

According to some aspects of the present disclosure, the display apparatus can further comprise a plurality of gate signal lines disposed on the wiring substrate and extending in a second direction intersecting with the plurality of link lines in a first direction.

According to some aspects of the present disclosure, the display apparatus can further comprise a first printed circuit board disposed on one end of the wiring substrate and configured to transmit signals to the plurality of link lines, a second printed circuit board disposed on the other end opposite to the end of the wiring substrate and configured to transmit signals to the plurality of link lines, a third printed circuit board disposed on one end of the wiring substrate in the second direction corresponding to the plurality of gate signal lines and configured to transmit a signal to the plurality of gate signal lines, and a fourth printed circuit board disposed on the other end opposite to the end of the wiring substrate and configured to transmit a signal to the plurality of gate signal lines.

It will be apparent to those skilled in the art that various modifications and variations can be made in the display apparatus of the present disclosure without departing from the technical idea or scope of the present disclosure. Thus, it is intended that the present disclosure cover the modifications and variations of this disclosure provided that within the scope of the claims and their equivalents.

What is claimed is:

1. A display apparatus, comprising:
a wiring substrate;
a plurality of link lines disposed on the wiring substrate;
a display part disposed on the wiring substrate, the display part including a plurality of light-emitting elements and a plurality of signal lines;
a first pad electrode overlapping an end portion of the plurality of link lines;
a second pad electrode overlapping an end portion of the plurality of signal lines; and
a passivation layer disposed on each of the first pad electrode and the second pad electrode;
dams disposed on the passivation layer, the dams including a plurality of individual dams spaced apart from each other on the passivation layer; and
a conductive pattern electrically connected to the first pad electrode and the second pad electrode,
wherein the conductive pattern extends along a plurality of stepped portions formed by the individual dams and the passivation layer to be in physical contact with the plurality of stepped portions.

2. The display apparatus of claim 1, further comprising:
a first printed circuit board disposed on one end of the wiring substrate and configured to transmit a signal to the plurality of link lines; and
a second printed circuit board disposed on another end opposite to the one end of the wiring substrate and configured to transmit a signal to the plurality of link lines.

3. The display apparatus of claim 1, wherein each of the plurality of link lines extends in a direction in which the first pad electrode of the wiring substrate and the second pad electrode of the display part are arranged in a line.

4. The display apparatus of claim 1, wherein the conductive pattern includes silver ink or silver paste.

5. The display apparatus of claim 1, further comprising a protection layer covering the conductive pattern.

6. The display apparatus of claim 1,
wherein the passivation layer includes a first portion disposed on the first pad electrode and a second portion disposed on the second pad electrode,
wherein an end of the first portion of the passivation layer is disposed inwardly of an end of the first pad electrode so that a portion of a surface of the first pad electrode is exposed, and
wherein an end of the second portion of the passivation layer is disposed inwardly of an end of the second pad electrode so that a portion of a surface of the second pad electrode is exposed; and
wherein the dams are disposed inwardly of an end of the passivation layer.

7. The display apparatus of claim 6, wherein the dams include:
a first dam disposed on the first portion of the passivation layer so that an end of the first dam is disposed inwardly of the end of the first portion; and
a second dam disposed on the second portion of the passivation layer so that an end of the second dam is disposed inwardly of the end of the second portion.

8. The display apparatus of claim 1, wherein an end of the display part includes a base substrate having the plurality of light-emitting elements and the plurality of signal lines,
wherein an end of the base substrate has an inclined surface inclined with respect to a flat upper surface of the wiring substrate, and
further comprising a step reduction layer disposed between the inclined surface of the base substrate and the wiring substrate.

9. The display apparatus of claim 1,
wherein the passivation layer includes a plurality of open holes exposing at least an upper surface of the first pad electrode and the second pad electrode;
wherein the plurality of individual dams include a plurality of dam patterns exposing the plurality of open holes; and
further comprising a functional layer disposed under the conductive pattern.

10. The display apparatus of claim 9, further comprising:
a first connection electrode in contact with a portion of the first pad electrode exposed through the plurality of open holes, and disposed between the first pad electrode and the conductive pattern; and
a second connection electrode in contact with a portion of the second pad electrode exposed through the plurality of open holes, and disposed between the second pad electrode and the conductive pattern,
wherein at least one of the first and second connection electrodes extends following a profile of the plurality of stepped portions.

11. The display apparatus of claim 1, further comprising a plurality of gate signal lines disposed on the wiring substrate and extending in a second direction intersecting with the plurality of link lines extending in a first direction.

12. The display apparatus of claim 11, further comprising:
a first printed circuit board disposed on one end of the wiring substrate and configured to transmit signals to the plurality of link lines;
a second printed circuit board disposed on another end opposite to the one end of the wiring substrate and configured to transmit signals to the plurality of link lines;
a third printed circuit board disposed on one end of the wiring substrate in the second direction corresponding to the plurality of gate signal lines, and configured to transmit a signal to the plurality of gate signal lines; and a fourth printed circuit board disposed on another end opposite to the one end of the wiring substrate and configured to transmit a signal to the plurality of gate signal lines.

13. The display apparatus of claim 1, wherein the conductive pattern is disposed along a path varying in elevation from a first height where the second pad electrode of the display part is located to a second height where the first pad electrode of the wiring substrate is located.

14. A display apparatus, comprising:

a wiring substrate including a plurality of link lines;

a display part disposed on the wiring substrate, the display part including a plurality of light-emitting elements and a plurality of signal lines;

a first pad electrode overlapping an end portion of the plurality of link lines;

a second pad electrode overlapping an end portion of the plurality of signal lines;

a conductive pattern electrically connected to the first pad electrode and the second pad electrode;

a plurality of gate signal lines disposed on the wiring substrate and extending in a second direction intersecting with the plurality of link lines extending in a first direction;

a first printed circuit board disposed on one end of the wiring substrate and configured to transmit signals to the plurality of link lines;

a second printed circuit board disposed on another end opposite to the one end of the wiring substrate and configured to transmit signals to the plurality of link lines;

a third printed circuit board disposed on one end of the wiring substrate in the second direction corresponding to the plurality of gate signal lines, and configured to transmit a signal to the plurality of gate signal lines; and a fourth printed circuit board disposed on another end opposite to the one end of the wiring substrate and configured to transmit a signal to the plurality of gate signal lines.

* * * * *